United States Patent
Inaba et al.

(10) Patent No.: US 6,780,502 B2
(45) Date of Patent: Aug. 24, 2004

(54) INSULATING RESIN COMPOSITION AND LAMINATE OBTAINED THEREFROM

(75) Inventors: Shinji Inaba, Chiba (JP); Koji Nakamura, Chiba (JP); Koichi Fujishiro, Tokyo (JP); Kazuhiko Mizuuchi, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/261,625

(22) Filed: Oct. 2, 2002

(65) Prior Publication Data

US 2003/0091844 A1 May 15, 2003

(30) Foreign Application Priority Data

Oct. 2, 2001 (JP) ....................... 2001-306766

(51) Int. Cl.[7] ............... B32B 27/18; B32B 27/20; B32B 27/36; C08L 67/00; C08L 67/06
(52) U.S. Cl. ............... 428/327; 428/323; 428/480; 428/482; 428/413; 525/107; 525/112; 525/165; 525/168; 525/170; 525/171; 525/172
(58) Field of Search ............... 428/323, 327, 428/413, 480, 482; 525/107, 112, 165, 168, 170, 171, 172; 522/6, 100, 104, 107, 108, 1

(56) References Cited

U.S. PATENT DOCUMENTS

| | | | | |
|---|---|---|---|---|
| 5,849,857 A | * | 12/1998 | Awaji et al. | ................. 528/98 |
| 5,914,216 A | * | 6/1999 | Amou et al. | ............. 430/280.1 |
| 6,146,749 A | * | 11/2000 | Miyamoto et al. | ....... 428/320.2 |
| 6,338,936 B1 | * | 1/2002 | Ichikawa et al. | ......... 430/285.1 |
| 6,458,509 B1 | * | 10/2002 | Haruta | .................... 430/280.1 |

FOREIGN PATENT DOCUMENTS

| | | |
|---|---|---|
| JP | 08-139457 | 5/1996 |
| JP | 10-147685 | 6/1998 |
| JP | 10-182758 | 7/1998 |
| WO | WO00/58788 | 10/2000 |

* cited by examiner

*Primary Examiner*—Vivian Chen
(74) *Attorney, Agent, or Firm*—Rader, Fishman & Grauer PLLC

(57) ABSTRACT

This invention relates to an insulating resin composition which exhibits high impact resistance and heat resistance and good adhesiveness to the plating metal, is selectively etchable by a permanganate salt commonly used in a plating operation and suited for an insulating layer in multilayer wiring boards. The insulating resin composition is a photopolymerizable or thermally polymerizable resin composition comprising 3–10 parts by weight of a crosslinked elastic polymer per 100 parts by weight of a resin component (excluding the crosslinked elastic poly and including monomers) and said crosslinked elastic polymer has carboxyl groups and is dispersed with an average secondary particle diameter in the range of 0.5–2 $\mu$m.

9 Claims, No Drawings

INSULATING RESIN COMPOSITION AND LAMINATE OBTAINED THEREFROM

FIELD OF TECHNOLOGY

This invention relates to an insulating resin composition which is suited for a solder resist or a plating resist in the fabrication of circuit boards and for an insulating film and a photosensitive adhesive for the build-up of multilayer wiring boards for mounting semiconductor devices, to a laminate obtained from said composition and to a cured product of said composition.

BACKGROUND TECHNOLOGY

Following the trend of electronic instruments towards advanced miniaturization and higher performance in recent years, there is a trend toward higher circuit density in the printed circuit boards which are used in electronic instruments and insulating resin materials to be used in printed circuit boards are required to show finer processibility. Patterning by exposure to light and development has been known as an effective technique for fine processing of insulating resin materials; this technique has relied on the use of photosensitive resin compositions and there are presently a number of performance requirements for them, for example, photosensitivity, adhesiveness to the substrate and reliability represented by impact resistance and resistance to plating.

Some insulating materials for printed wiring boards aim at preventing an occurrence of cracking and letting impact resistance and heat resistance coexist with electrical insulation reliability and a technique of incorporating fine particles of crosslinked elastic polymer with an average diameter of 5 μm or less in an insulating resin composition is disclosed in JP10-147685 A. However, the technique disclosed here yielded dispersed particles still too large in diameter and was unable to realize the coexistence of impact resistance and adhesiveness to the substrate at a sufficiently high level.

On the other hand, a resin composition containing finer particles with a diameter on the order of 70 nm is disclosed in JP8-139457 A. As pointed out later by JP10-182758 A, however, this resin composition cannot provide a sufficiently high peel strength against a plating metal because of insufficient anchor depth and surface roughness when used for insulation. JP10-182758 A discloses a composition formulated by the simultaneous use of a crosslinked elastic polymer with a particle diameter of less than 1 μm and a matter with a particle diameter of 1–10 μm. However, the technique disclosed here requires the crosslinked elastic polymer in a relatively large amount and, in the case where a base resin of high heat resistance is used, the incorporation of the crosslinked elastic polymer in question undesirably deteriorates the heat resistance of the insulating resin layer containing such base resin.

SUMMARY OF THE INVENTION

An object of this invention is to provide an insulating resin composition which exhibits excellent adhesiveness to plating metals, heat resistance, resolution characteristics and impact resistance, comprises a crosslinked elastic polymer amenable to selective etching by a permanganate salt that is used in an ordinary plating operation and is suited for an insulating resin layer in a multilayer printed wiring board and to provide a laminate such as dry film formed from said composition.

The insulating resin composition of this invention comprises a crosslinked elastic polymer in a photopolymerizable or thermally polymerizable resin composition at the rate of 3–10 parts by weight of said crosslinked elastic polymer per 100 parts by weight of a resin component (excluding said crosslinked elastic polymer and including monomers) and said crosslinked elastic polymer has carboxyl groups and is dispersed with an average secondary particle diameter in the range of 0.5–2 μm. This insulating resin composition can be laminated to a separable support. Furthermore, this invention relates to a polymer or a cured product of the aforementioned insulating resin composition.

DETAILED DESCRIPTION OF THE INVENTION

This invention will be described in detail below.

The insulating resin composition of this invention comprises a crosslinked elastic polymer and a resin component comprising a photo-polymerizable or thermally polymerizable resin or monomer as main ingredients. The resin component here is adequate if it comprises one kind or more of photo-polymerizable or thermally polymerizable resins, oligomers and monomers and is subject to no other restriction. The resin component may be heat-curable or photocurable or both. Moreover, the resin component may be photosensitive and preferably comprises a carboxyl-containing copolymer which can be developed by an aqueous alkaline solution. Since the resin, oligomer or monomer in the insulating resin composition with the exception of the crosslinked elastic polymer forms a matrix resin phase after polymerization or curing, it is occasionally referred to as resin component or matrix resin component in the following description.

The resin component comprises, as main ingredients, (A) a carboxyl-containing copolymer resulting from the reaction of a diol with a polyvalent carboxylic acid and having a weight average molecular weight of 3,000–40,000 and an acid value of 50–200 mgKOH/g, (B) an unsaturated compound containing one or more photo-polymerizable ethylenic unsaturated linkages in the molecule, (C) an epoxy resin and (D) a photopolymerization initiator and, preferably, the resin component comprises 100 parts by weight of the sum of components (A) and (B), 10–30 parts by weight of component (C) and 0.1–15 parts by weight of component (D).

Diols useful for the preparation of the aforementioned carboxyl-containing copolymer (A) preferably possess a symmetrical molecular structure from the viewpoint of increasing the molecular weight during polymerization because the symmetrical structure renders two hydroxyl groups in a diol molecule equally reactive with two carboxyl groups in a polyvalent carboxylic acid, preferably with two acid anhydride groups in an acid dianhydride.

Concrete examples of diols are ethylene glycol, diethylene glycol, polyethylene glycol, polypropylene glycol, hydrogenated bisphenol A, bis(4-hydroxyphenyl) ketone, bis(4-hydroxyphenyl) sulfone, 2,2-bis(4-hydroxyphenyl) propane, bis(4-hydroxyphenyl) ether, bis(4-hydroxyphenyl) hexafluoropropane, 9,9-bis(4-hydroxyphenyl)fluorene, bis(4-hydroxyphenyl)dimethylsilane and 4,4'-biphenol. Examples also include addition compounds of various diglycidyl ethers of the aforementioned diols and (meth)acrylic acid, addition products of alicyclic epoxy compounds and (meth)acrylic acid and addition products of the aforementioned bisphenols and ethylene oxide or propylene oxide. Particularly preferred from the viewpoint of improved sensitivity to light exposure and enhanced resolution are the addition products of (meth)acrylic acid because they possess polymerizable unsaturated linkages and alkali-soluble carboxyl groups in the same molecule after the reaction with a polyvalent carboxylic acid.

Among carboxyl-containing copolymers, resins containing a fluorene skeleton in their unit structure (hereinafter referred to as fluorene skeleton-containing resin) are desirable for manifestation of excellent heat resistance and the use of the carboxyl-containing copolymer in which the fluorene skeleton-containing resin accounts for 30 wt % or more, preferably 50 wt % or more, is effective for manifesting heat resistance of the insulating resin composition.

Particularly preferred fluorene skeleton-containing resins are those which possess a fluorene skeleton and are obtained by the reaction of a fluorene epoxy(meth)acrylate represented by the following general formula (1)

linkages in the molecule is used, typical examples of such unsaturated compounds are acrylates including hydroxyl-containing (meth)acrylates such as polyethylene glycol (meth)acrylate and butanediol mono(meth)acrylate, aliphatic (meth)acrylates such as allyl (meth)acrylate, butoxytriethylene glycol (meth)acrylate, glycidyl (meth)acrylate, methacryloyloxypropyltrimethoxysilane, tetrafluoropropyl (meth)acrylate and dibromopropyl (meth)acrylate, alicyclic (meth)acrylates such as cyclohexyl (meth)acrylate and isobornyl (meth)acrylate, aromatic (meth)acrylates and phosphorus-containing (meth)acrylates.

Moreover, examples include bifunctional compounds such as diethylene glycol di(meth)acrylate, bisphenol A di(meth)acrylate and tetrabromobisphenol A di(meth) acrylate. Still more, examples include trifunctional and higher compounds such as trimethylolpropane tri(meth) acrylate, pentaerythritol tri(meth)acrylate, pentaerythritol tetra(meth)acrylate, dipentaerythritol tetra(meth) acrylate,

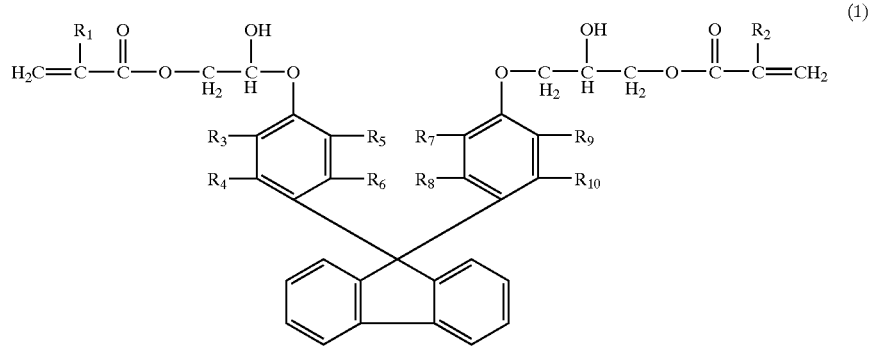

(1)

(wherein $R_1$ and $R_2$ are hydrogen or methyl group and different from or identical with each other and $R_3$–$R_{10}$ are hydrogen, an alkyl group with 1–5 carbon atoms or halogen and different from or identical with one another) with a polyvalent carboxylic acid or its acid anhydride. The reaction of a fluorenebisphenol type epoxy(meth)acrylate represented by general formula (1) with a polyvalent carboxylic acid or its acid anhydride yields an alkali-soluble product.

Polyvalent carboxylic acids include their acid anhydrides, acid chlorides and the like and acid anhydrides are preferred. Examples of polyvalent carboxylic acids are maleic acid, succinic acid, itaconic acid, phthalic acid, tetrahydrophthalic acid, hexahydrophthalic acid, chlorendic acid, methylendomethylenetetrahydrophthalic acid, methyltetrahydrophthalic acid, pyromellitic acid, benzophenonetetracarboxylic acid, biphenyltetracarboxylic acid and diphenylethertetracarboxylic acid. Polyvalent carboxylic acids preferably contain, at least partly, tetracarboxylic acids or their dianhydrides. The aforementioned polyvalent carboxylic acids may be used singly or as a mixture of two kinds or more.

The reaction of a diol such as an epoxy(meth)acrylate with a polyvalent carboxylic acid can be effected by a known method. A polycarboxylic acid to be used is preferably the acid anhydride(s) of one or a mixture of tribasic and higher acids in order to control the acid value of the resulting resin at 10 mgKOH/g or more for full manifestation of alkali solubility.

As for a method for the preparation of carboxyl-containing copolymer (A), the one described in JP7-3122 A may be adopted.

In the case where an unsaturated compound (B) containing one or more photo-polymerizable ethylenic unsaturated dipentaerythritol hexa(meth)acrylate, alkyl-modified dipentaerythritol penta(meth)acrylate and urethane tri(meth) acrylate.

The products obtained by modifying the aforementioned monofunctional, bifunctional, trifunctional and higher compounds containing ethylenic unsaturation with caprolactone, propylene oxide or ethylene oxide can be used in the same manner. Other polymerizable monomers, for example, monofunctional vinyl compounds such as vinyl acetate, vinylcaprolactam, vinylpyrrolidone and styrene, can also be used in case of need. Polyesters and vinyl polymers can also be used in case of need. The aforementioned compounds of varying functionality and their modified products and resins can be used not only singly but also as a mixture of two kinds or more. The average number of ethylenic unsaturated bonds in one molecule is preferably 1.5 or more.

In the case where excellent photo-curability or higher photosensitivity is required in addition to alkali solubility for the insulating resin composition of this invention, it is preferable to incorporate a resin or monomer having two (bifunctional) or more, preferably three (trifunctional) or more, polymerizable double bonds in the molecule. The amount to be used of unsaturated compound (B) having one or more photo-polymerizable ethylenic unsaturated linkages is preferably in the range of 10–200 parts by weight per 100 parts by weight of carboxyl-containing copolymer (A).

Examples of epoxy resin (C) to be incorporated include epoxy resins such as phenol novolak epoxy resins, cresol novolak epoxy resins, bisphenol A epoxy resins, bisphenol F epoxy resins, bisphenol S epoxy resins, biphenyl epoxy resins and alicyclic epoxy resins and compounds having at least one epoxy group such as phenyl glycidyl ether, p-butylphenyl glycidyl ether, triglycidyl isocyanurate, diglycidyl isocyanurate, allyl glycidyl ether and glycidyl methacrylate.

In the case where the matrix resin is rendered alkali-soluble, the amount of epoxy resin to be used is kept within such a range as to maintain the property of alkali solubility or preferably in the range of 10–30 parts by weight per 100 parts by weight of the sum of the components (A) and (B).

Examples of photopolymerization initiator (D) to be incorporated include radical generators such as Michler's ketone and cation generators such as triarylphosphonium salts and diaryliodonium salts. Such initiators can be used singly or as a mixture of two kinds or more. The amount of photopolymerization initiator to be used is preferably 0.1–15 parts, more preferably 1–5 parts by weight per 100 parts by weight of the sum of the components (A) and (B). Use in excess of 15 parts by weight increases light absorption and there is the possibility of light not penetrating to the lower part.

The photopolymerization initiator may be incorporated in combination with a known photosensitizer such as ethyl N,N-dimethylaminobenzoate, isoamyl N,N-dimethylaminobenzoate, triethanolamine and triethylamine. Photosensitizers may be used singly or as a mixture of two kinds or more and the amount to be used is preferably 10–70 wt % of the photopolymerization initiator.

The insulating resin composition of this invention is a dispersion of the carboxyl-containing crosslinked elastic polymer in the matrix resin phase. The crosslinked elastic polymer is incorporated in the insulating resin composition of this invention to achieve the following objective. The crosslinked elastic polymer disperses in the insulating resin composition with the secondary particle diameter controlled in the specified range to form a sea-island structure and, after curing, forms the dispersed phase with a particle diameter of 0.5–2 $\mu$m in the insulating resin layer thereby providing said insulating resin layer with cracking resistance. At the same time, the cured resin layer is subjected to the dissolving action of a roughening solution to create unevenness on its surface for anchor effect and improved adhesion of the resin layer to the plating metal.

Examples of the crosslinked elastic polymer to be used in this invention include carboxyl-containing crosslinked acrylic rubber, carboxyl-containing crosslinked NBR and carboxyl-containing crosslinked MBS. Carboxyl-containing acrylic rubber and carboxyl-containing NBR are particularly preferred in respect to roughening as they are easy to dissolve and carboxyl-containing acrylic rubber is preferred in respect to insulation properties after curing.

The amount of the carboxyl group of the crosslinked elastic polymer to be incorporated is preferably 1–50 (mgKOH/g) in terms of acid value. An acid value of less than 1 deteriorates adhesiveness to the resin composition and the solubility during development and roughening. On the other hand, an acid value in excess of 50 deteriorates moisture resistance reliability and storage stability of the resin composition.

The primary particle diameter of the crosslinked elastic polymer is 0.1 $\mu$m or less, preferably in the range of 0.03–0.9 $\mu$m. The secondary particle diameter determined by observing the cured polymer by a transmission electron microscope (TEM) and applying the area average method is in the range of 0.5–2 $\mu$m, preferably in the range of 0.6–1.5 $\mu$m. Preferably, 80% or more of the particles exists in the aforementioned range.

The amount of the crosslinked elastic polymer to be used needs to be 3–10 parts by weight, preferably 4–8 parts by weight, per 100 parts by weight of the aforementioned matrix resin or resin component. Use of less than 3 parts by weight does not yield sufficient adhesiveness to the plating metal and manifestation of impact resistance becomes difficult. On the other hand, use in excess of 10 parts by weight presents no problem in respect to impact resistance and adhesiveness, but the heat resistance of the resin layer deteriorates and, besides, the crosslinked elastic polymer which dispersed once develops a tendency to agglomerate again; this means that, when the insulating resin composition of this invention is made into a varnish, the crosslinked elastic polymer separates and precipitates and this prevents a stable operation in coating of the varnish.

It is possible to add a flocculated to the insulating resin composition of this invention to stabilize the flocculation of the fine particles of the crosslinked elastic polymer and control the secondary particle diameter. A common polymeric flocculant is useful as a flocculant of this kind and examples include cationic polymers such as sodium alginate, poly(sodium acrylate), salts of partial hydrolyzates of polyacrylamide and maleic acid copolymers, anionic polymers such as water-soluble aniline resins, polythiourea, polyethyleneimine, quaternary ammonium salts and polyvinylpyridines and nonionic polymers such as acrylamide and polyoxyethylene.

Furthermore, it is allowable to incorporate in the insulating resin composition of this invention one or more of inorganic fillers such as silica, alumina, titanium oxide and boron nitride for the purpose of lowering thermal expansion and improving elasticity modulus and moisture absorption of the cured product. Still more, it is allowable to incorporate additives such as curing accelerators of epoxy resins, polymerization inhibitors, plasticizers, leveling agents, anti-foaming agents and colorants as occasion demands. In addition, curing agents of epoxy resins, solvent-soluble resins and the like may be incorporated and the curing agents and the resins are calculated as matrix resin.

Curing accelerators of epoxy resins include amines, imidazoles, carboxylic acids, phenols, quaternary ammonium salts and methylol-containing compounds. Polymerization inhibitors include hydroquinone, hydroquinone monomethyl ether, pyrogallol, tert-butylcatechol and phenothiazine. Plasticizers include dibutyl phthalate, dioctyl phthalate and tricresyl phosphate. Anti-foaming agents and leveling agents include silicones, fluorine-containing compounds and acrylic compounds.

The viscosity of the resin composition for electrical insulation of this invention can be controlled by incorporating a solvent as needed. A solvent of this kind must be capable of dissolving the resin component of the aforementioned photosensitive resin composition and, in addition, inert to the resins in the matrix resin component and to the additives. The solvent to be used must satisfy these conditions, but is subject to no other restriction.

The insulating resin composition of this invention can occur in the following states: (i) a solid or a liquid without a solvent, (ii) a liquid (varnish) formed by dissolving the composition in a solvent, (iii) a dry matter formed by drying the varnish and (iv) any of the foregoing three in which a filler is incorporated. In the case where the insulating resin composition of this invention occurs in any of the states (i) to (iv), the proportions of the matrix resin component and the crosslinked elastic polymer are in the aforementioned range and the crosslinked elastic polymer accounts for 3–10 wt %, preferably 5–9 wt %, of the whole and the matrix resin component accounts for 80–97 wt %, preferably 85–97 wt %, more preferably 90–95 wt %, of the whole. In addition, additives may be incorporated in small amounts.

Moreover, the insulating resin of this invention may occur in the state of (V) a solid resulting from polymerization or curing of the insulating resin composition and its resin phase contains of the dispersed phase made up of the crosslinked elastic polymer and the matrix resin phase made up of the matrix resin component. In the case of state (V), the crosslinked elastic polymer in the cured product accounts for 3–10 wt %, preferably 5–9 wt %, of the whole and the matrix resin phase accounts for 80–97 wt %, preferably 85–97 wt %, more preferably 90–95 wt %, of the whole. In the states (i) to (iv) where solvents and fillers are incorporated, the aforementioned proportions preferably hold under conditions where the solvents and fillers are excluded. The conditions where the solvents and fillers are excluded mean that they are excluded in calculating the proportions. As noted above, the matrix resin component consists of components A–D and other ingredients such as a curing agent of epoxy resin and the like.

The method for preparing the insulating resin composition of this invention will be explained next. The insulating resin composition of this invention can be formulated, for example, from the crosslinked elastic polymer which has been dispersed in a solvent to primary particles with a diameter of 100 nm or less in advance, the aforementioned carboxyl-containing copolymer (A), unsaturated compound (B) containing one or more photo-polymerizable ethylenic unsaturated linkages in the molecule, epoxy resin (C), photopolymerization initiator (D) and other additives such as photo-initiation aids, coupling agents and antioxidants. It is desirable in the formulating step to use a solvent to control the viscosity of the resin composition solution. The resin composition solution containing the crosslinked elastic polymer is agitated in a known agitator at normal temperature for several minutes to several hours to yield a resin composition solution in which the crosslinked elastic polymer is dispersed to an average secondary particle diameter in the range of 0.5–2 $\mu$m. The average secondary particle diameter of the crosslinked elastic polymer can be brought into the range of 0.5–2 $\mu$m by suitably controlling the kind of agitator and agitating element, agitating speed and shape of vessel. Crosslinked elastic polymers dispersed in advance to primary particles with a diameter of 100 nm or less are commercially available and one of them may be used here.

If agitated not sufficiently in the step for agitation, large agglomerates would form with an average secondary particle diameter of 2 $\mu$m or more and manifestation of impact resistance becomes difficult. If agitated too vigorously, the crosslinked elastic polymer would undergo secondary agglomeration with difficulty and disperse close to the primary particle diameter thereby undesirably deteriorating the adhesive strength of the plated metal at the time of roughening. In order to stabilize the secondary particle diameter, the resins are mixed and then the mixture may be put through a filter with a pore diameter of 0.5–5 $\mu$m. A filter with a pore diameter of less than 0.5 $\mu$m would not only divide secondary agglomeration further but also present increased resistance to filtration to its disadvantage. A filter with a diameter of 5 $\mu$m or more would allow singularly large secondary agglomerates to remain in the filtered mixture and undesirably deteriorate the mechanical properties.

The insulating resin composition of this invention can be used, for example, in the following manner: (1) the composition is prepared as a varnish and applied to the object to form a layer of insulating resin and (2) a separable support is coated with the composition and stripped of the solvent to yield a laminate (dry film).

When used as a varnish, the insulating resin composition of this invention is made into a varnish and the substrate is coated with the varnish by such means as spin coating and curtain coating, dried, exposed to light, developed to form a pattern and heat-cured. When used as a pre-formed laminate, the support is coated uniformly with the insulating resin composition of this invention, stripped of the solvent by hot-air drying or the like, covered by a protective film if necessary and wound into a roll. The drying temperature is preferably 80–120° C. in consideration of the heat stability of the unsaturated compound and the productivity. Furthermore, the temperature is raised preferably in multiple steps in order to prevent skinning and foaming on the surface of the applied coating during drying.

The organic solvent frequently remains in the resin layer after drying and it is desirable to reduce the content of the residual organic solvent to 15 wt % or less, preferably 10 wt % or less. The content here refers to the loss in wt % when the resin layer after drying whose weight is taken as 100 wt % is heated again at 200° C. for 30 minutes to the absolute dry weight. Cold flow tends to occur when the content of the residual organic solvent exceeds 15 wt %.

The thickness of the insulating resin layer after drying varies with the end use and it is 1–10 $\mu$m for liquid crystal displays and 5–100 $\mu$m for circuit boards. Resolution improves as the resin layer becomes thinner and it becomes possible to form vias and lines with the diameter or width equal to or less than the thickness of the resin layer. For example, when the film thickness is 30 $\mu$m, it is possible to form 30 $\mu$m vias and 20 $\mu$m lines and spaces. Moreover, when the film thickness is 5 $\mu$m, it is possible to form a 20 $\mu$m isolated line or isolated dot.

The support (film) to which the resin composition is applied is preferably a transparent material which lets energetic radiation pass through. Examples of such a support include publicly known poly(ethylene terephthalate) films, polyacrylonitrile films, polypropylene films for optical use and films of cellulose derivatives. The film thickness is generally 10–30 $\mu$m out of necessity to maintain a certain film strength, although thinner films are more advantageous in respect to image formation and economy. In the laminate of this invention, the surface of the insulating resin layer on the side not in contact with the support can be laminated to a protective film as occasion demands. Preferably, the protective film here adheres to the insulating resin layer with a sufficiently lower strength than the support and is readily separable. An example of the protective film of this kind is polyethylene film.

Known techniques can be applied to the fabrication of circuit boards, multi-chip modules and color filters and spacers for liquid crystal displays by the use of the laminate of this invention. The fabrication of a circuit board is taken as an example and the steps involved are described briefly below.

In case the laminate has a protective film, the protective film is peeled off and the insulating resin layer is laminated to the surface of the substrate under heat and pressure by the use of a hot-roll laminator and the like. The heating temperature in this step is 70–120° C., preferably 80–110 ° C. The adhesiveness to the substrate deteriorates below 70° C. while the insulating resin layer protrudes from the edges adversely affecting the precision of film thickness above 120° C. The support is then peeled off and the insulating resin layer is exposed to energetic radiation through a mask for image transfer. Thereafter, the insulating resin layer is developed by an aqueous alkaline solution and the unexposed portion is removed. Useful here as a developer is an aqueous solution of sodium carbonate, potassium carbonate, potassium hydroxide, diethanolamine or tetramethylammonium hydroxide. A developer suited with the characteristics of the resin layer is selected and it may be used together with a surfactant. Finally, polymerization or curing (occasionally the two are put together and referred to as curing) is completed thermally to yield insulating resin, for example, permanent insulating film. In order to provide the resin with heat resistance or to provide the resin matrix with lower etching quality than that of the crosslinked elastic polymer in the etching step, the heat curing here is effected preferably in the range of 160–200° C.

The surface of heat-cured resin layer is planarized by buffing if necessary, then roughened by the publicly known desmear process with the use of a permanganate salt, and submitted to electroless copper plating and, if necessary, to electrolytic copper plating by a known technique to form a conductive layer. Annealing is preferably applied after electrolytic copper plating. A circuit is formed by selective etching of the conductive layer and a multilayer circuit board is formed by repeating the steps starting with the lamination of the insulating layer.

The insulating resin composition of this invention exhibits excellent impact resistance and high adhesiveness to the plating metal due to manifestation of the anchor effect after surface roughening. Moreover, the crosslinked elastic polymer can produce the anticipated effect when added in a relatively small amount and this helps to make the most of the intrinsic characteristics of the matrix resin constituting the resin composition; in case matrix resin of excellent heat resistance is used, the degradation of the heat resistance can be minimized. As noted above, the insulating resin composition of this invention can be used in a variety of applications requiring high impact resistance, good adhesiveness to the plating metal and good heat resistance and are useful as peripheral materials of electronic parts such as semiconductor devices. Moreover, the crosslinked elastic polymer used in this invention can be etched selectively by a permanganate salt which is used in an ordinary plating operation and is, in particular, extremely useful as a material for the insulating layer in multilayer printed circuit boards. Still more, the laminate of this invention not only has the properties of the insulating resin composition but also is easy to handle and yields high productivity when used in the formation of the insulating layer in multilayer wiring boards.

EXAMPLES

This invention will be described in detail below with reference to the synthetic examples, examples and comparative examples. Unless otherwise noted, the resins in the synthetic examples were evaluated as follows.

Solid content: A glass filter weighing $W_0$ (g) was impregnated with a resin solution, weighed [$W_1$(g)], heated at 160° C. for 2 hours and weighed [$W_2$(g)].

Solid content (wt %)=100×($W_2$−$W_0$)/($W_1$−$W_0$)

Acid value: A resin solution was added to a 1:1 dioxane-ethanol mixture on a volume basis and titrated with 1/10N KOH solution in 50% aqueous ethanol by the use of phenolphthalein as an indicator.

Molecular weight: The molecular weight was determined by gel permeation chromatography (GPC) while using a gel permeation chromatograph equipped with an RI (refractive index) detector and tetrahydrofuran as a developing solvent. The molecular weight thus determined is the weight average molecular weight ($M_w$) of the carboxyl-containing copolymer exclusive of the unreacted raw materials with polystyrene used as standard in establishing a calibration curve.

The abbreviations used in the synthetic examples stand for the following. PHPA: The product of the reaction in equivalent amounts of fluorenebisphenol type epoxy resin with acrylic acid (a solution of ASF-400 available from Nippon Steel Chemical Co., Ltd.; solid content 50 wt %, acid value of solid 1.28 mgKOH/g, epoxy equivalent 21,300)
BPDA: Biphenyltetracarboxylic acid dianhydride
THPA: Tetrahydrophthalic anhydride
PGMEA: Propylene glycol monomethyl ether acetate
TEABr: Tetraethylammonium bromide

Synthetic Example 1

In 300 -ml four-necked flask fitted with a reflux condenser were introduced 96.0 g of the FHPA solution, 14.4 g of BPDA, 2.5 g of PGMEA and 0.15 g of TEABr, the mixture was stirred at 120–125° C. for 2 hours with stirring and further heated at 60–62° C. for 8 hours with stirring to give a solution of carboxyl-containing copolymer A.

The evaluation of the resin solution thus obtained yielded the following results: solid content, 56.5 wt %; acid value (as solid), 90.3 mgKOH/g; area (%) of the carboxyl-containing copolymer in the resin solution determined by GPC, 90%; weight average molecular weight, 15,000.

Synthetic Example 2

In 300 -ml four-necked flask fitted with a reflux condenser were introduced 96.0 g of the FHPA solution, 10.8 g of BPDA, 5.6 g of THPA, 1.64 g of PGMEA and 0.15 g of TEABr, the mixture was stirred at 120–125° C. for 2 hours with stirring and further heated at 60–62° C. for 8 hours with stirring to give a solution of carboxyl-containing copolymer B.

The evaluation of the resin solution thus obtained yielded the following results: solid content, 56.5 wt %; acid value (as solid), 88.1 mgKOH/g; area (%) of the carboxyl-containing copolymer determined by GPC, 96%; weight average molecular weight, 5,400.

Example 1

Preparation of Resin Composition

A resin composition solution was prepared by mixing 30 parts by weight each as solid of the solutions of carboxyl-containing copolymers A and B (sum of 60 parts by weight), 12 parts by weight of trimethylolpropane triacrylate (TMPT) as an unsaturated compound, 7 parts by weight as solid of carboxyl-containing crosslinked rubber with an average particle diameter of 0.07 μm (XER-91 as 15% dispersion in MEK with an acid value of 10.0 mgKOH/g, available from JSR Corporation) as a crosslinked elastic polymer, 2 parts by weight of 2-methyl-1-[4-(methylthio)phenyl]-2-morpholinopropanone-1 as a photopolymerization initiator, 26 parts by weight of epoxy resin (Epikote 834 available from Yuka Shell Epoxy Co.,), 0.04 part by weight of a photosensitizer (EABF available from Hodogaya Chemical Co., Ltd.), 1.6 parts by weight of other additives and 100 parts by weight of ethyl acetate, agitating the mixture by an agitator for 1 hour to effect dissolution or dispersion and forcing the mixture through a filter with a pore diameter of 1 μm under pressure. The resin composition solution contained the crosslinked elastic polymer as a dispersion with an average secondary particle diameter of approximately 1 μm.

Preparation of Dry Film Laminate

The resin composition solution prepared in the aforementioned manner was applied to a polyester film, 25 μm thick and 600 mm wide, by a die coater and dried in a continuous four-stage oven which was operated at a temperature set in the range of 80–120° C. to yield a 30 μm-thick layer of the insulating resin containing 2.3% of the residual solvent. A 60 μm-thick protective film made of polyethylene was laminated to the coated side of the insulating resin layer to give a dry film laminate.

Fabrication of Multilayer Printed Wiring Board

A conductive circuit pattern on a commercial 0.8 mm-thick glass-epoxy base material was submitted to the black oxide treatment, the aforementioned dry film laminate from which the protective polyethylene film had been peeled off was laminated to the glass-epoxy base material at 80° C., a transfer pressure of 3 kgf/cm$^2$G and a transfer speed of 25 cm/min, and the polyester film was peeled off after cooling to form a 30 μm-thick insulating resin layer on the conductive circuit pattern.

Thereafter, a negative mask provided with a via hole pattern was placed on the aforementioned insulating resin layer, exposed to UV at 250 mJ/cm$^2$ by the use of an ultrahigh pressure mercury lamp (a product of HI-TECH Co., Ltd; illuminance 11 mJ/cm$^2$, I-line as standard), developed by a 1.2% aqueous solution of tetramethylammonium hydroxide while shaking the panel at 28° C. for 1 minute until the conductive circuit pattern was exposed, and rinsed by purified water at a pressure of 3.0 kg/cm$^2$ for 30 seconds to form via holes with a diameter of 30 μm. Following this, the panel was heat-cured in air at 180° C. for 60 minutes to yield an insulating film.

Roughening of Insulating Film

The surface of the insulating film thus obtained was buffed, equivalent to 3 g/m$^2$, by a sand paper (#1000) and then roughened according to the desmear process developed by Ebara Densan Ltd. as follows. The board was immersed in a 50% aqueous solution of DI-464 at 70° C. for 5 minutes to swell the surface, washed immediately thereafter with water for 1 minute and with hot water at 50° C. for 2 minutes, and immersed in the roughening solutions PM-465A (50 g/l) and PM-465B (15%), both based on potassium permanganate, at 60° C. for 5 minutes to effect surface roughening. The assembly was then washed with water for 1 minute and treated with a neutralizing liquid N-466 at room temperature for 5 minutes to remove the residual potassium permanganate solution on the surface. The board was washed with water for another 1 minute, then washed in an ultrasonic cleaner for 10 minutes, and dried at 80° C. for 1 hour. In this manner, anchors were formed on the roughened surface of the insulating layer.

Plating of the Roughened Surface

The aforementioned board was submitted to electroless copper plating by the OPC Process developed by Okuno Chemical Industries Co., Ltd., then submitted to electrolytic copper plating at a current density of 2–2.5 A/dm$^2$ by the electrolytic copper plating process developed by C. Uyemura & Co., Ltd. to form a 18 μm-thick pinhole-free layer of copper, and finally submitted to a heat treatment at 110° C. for 60 minutes and at 180° C. for 60 minutes to form a conductive layer on the insulating resin layer.

Patterning of the Conductive Layer

An etching resist was formed in a known manner on the conductive layer, the copper on the unnecessary parts was removed and the resist was dissolved off to yield a multilayer printed wiring board containing plated via holes.

The multilayer wiring board prepared as described above was evaluated as follows.

The 90-degree peel strength determined in accordance with JIS C6481 was 1.0 kg/cm.

The condition of the roughened surface of the cured film was observed by a scanning electron microscope (SEM) and the average diameter of the pores formed by roughening was found to be approximately 1 μm with the aid of an image analysis software developed by Computer Build Co., Ltd.

Moreover, the condition of the dispersed crosslinked elastic polymer inside the cured film was observed by a transmission electron microscope (TEM); the particles underwent partial re-agglomeration and the average diameter of these secondary particles was found to be approximately 1 μm with the aid of an image analysis software developed by Computer Build Co., Ltd.

Test specimens were prepared for measuring the properties of the insulating film itself. The aforementioned laminate stripped of the protective film was laminated at a transfer pressure of 3 kgf/cm$^2$G and a transfer speed of 25 cm/min to a commercial 4-inch silicon wafer on which aluminum had been deposited and the polyester film was peeled off after cooling to form a 30 μm-thick insulating layer on the aluminum-deposited wafer. A negative mask provided with a pattern for test specimen was placed on the insulating layer of the aforementioned wafer, exposed to UV at 250 mJ/cm$^2$ by the use of an ultrahigh pressure mercury lamp (a product of HI-TECH Co., Ltd; illuminance 11 mJ/cm$^2$, I-line as standard), developed by a 1.2% aqueous solution of tetramethylammonium hydroxide while shaking the assembly at 28° C. for 1 minute until the aluminum-deposited wafer was exposed, and rinsed with purified water at a pressure of 3.0 kg/cm$^2$ to yield a test specimen. The test specimen was heat-cured in air at 180° C. for 90 minutes to obtain the cured insulating film.

The test specimen was submitted to the tensile test by the use of an Instron tester, Model 5582, and the modulus of elasticity determined from the slope of the stress-strain curve was 2.1 GPa. The elongation was 8.3%. The glass transition temperature determined by the kinetic viscoelastic method was 156° C.

Example 2

The test was carried out as in Example 1 with the exception that crosslinked rubber (XER-91) with an average primary particle diameter of 0.07 μm was used as the crosslinked elastic polymer in an amount of 5 parts by weight as solid.

Example 3

The test was carried out as in Example 1 with the exception that crosslinked rubber (XER-91) with an average primary particle diameter of 0.07 μm was used as the crosslinked elastic polymer in an amount of 9 parts by weight as solid.

Example 4

The test was carried out as in Example 1 with the exception that carboxyl-containing copolymer solution A obtained in the Synthetic Example 1 was used in an amount of 60 parts by weight as solid and dipentaerythritol hexaacrylate (Kayarad DPHA, available from Nippon Kayaku Co., Ltd.) and DPCA (Kayarad DPCA-60, available from Nippon Kayaku Co., Ltd.) were used, each in an amount of 6 parts by weight, as the unsaturated compound.

Comparative Example 1

A composition was formulated as in Example 1, agitated by an agitator for 1 hour to effect dissolution or dispersion and forced through a filter with a pore diameter of 20 μm under pressure to prepare a resin solution.

Comparative Example 2

A composition was formulated as in Example 1, agitated more vigorously than in Example 1 and forced through a filter with a pore diameter of 1 μm under pressure to prepare a resin solution.

Comparative Example 3

The procedure of Example 1 was repeated to prepare a resin solution with the exception that crosslinked rubber with an average primary particle diameter of 0.07 μm (XER-91, 15% dispersion in MEK; available from JSR Corporation) was used as the crosslinked elastic polymer in an amount of 12.5 parts by weight as solid.

Comparative Example 4

The procedure of Example 1 was repeated to prepare a resin solution with the exception that crosslinked rubber with an average primary particle diameter of 0.3 μm (XCS-3, available from JSR Corporation) was used as the crosslinked elastic polymer. The agglomeration of rubber particles did not occur and the particle diameter remained unchanged at 0.3 μm.

The results are shown in Table 1.

In Examples 1–4, the elongation that is useful as an indicator of adhesiveness to the plating metal, heat resistance and impact resistance showed an increase or an indication of good performance in these properties. On the contrary, in Comparative Example 1, excessive unevenness was observed in the 30 μm-thick resin layer after surface roughening and at the same time the elongation dropped and good properties were not obtained. In Comparative Example 2, secondary particles were not observed, the crosslinked polymer was dispersed with a particle diameter of 70 nm and the adhesiveness was extremely poor. In Comparative Example 3, the sedimentation of agglomerates was observed when the composition was made into a varnish and the heat resistance deteriorated and good properties were not obtained. In Comparative Example 4, sufficient adhesiveness to the plated metal was not obtained.

TABLE 1

|  | Example | | | | Comparative example | | | |
| --- | --- | --- | --- | --- | --- | --- | --- | --- |
|  | 1 | 2 | 3 | 4 | 1 | 2 | 3 | 4 |
| Copolymer solution | A/B = 1/1 | A/B = 1/1 | A/B = 1/1 | A | A/B = 1/1 | A/B = 1/1 | A/B = 1/1 | A/B = 1/1 |
| Unsaturated compound | TMPT | TMPT | TMPT | DPHA DPCA | TMPT | TMPT | TMPT | TMPT |
| Crosslinked elastomer | XER-91 | XER-91 | XER-91 | XER-91 | XER-91 | XER-91 | XER-91 | XCS-3 |
| Amount incorporated (Part by weight) | 7 | 5 | 9 | 7 | 7 | 7 | 12.5 | 7 |
| Surface condition of resin laminate | Good | Good | Good | Good | Good | Good | Bad | Good |
| Peel strength of copper foil (kg/cm) | 1.0 | 0.92 | 1.1 | 1.0 | 1.1 | 0.2 | 1.0 | 0.2 |
| Average particle diameter of roughened part (μm) | 1 | 1 | 1 | 1 | 10 | <0.1 | 1.5 | 0.5 |
| Average particle diameter observed by TEM (μm) | 1 | 1 | 1 | 1 | 10 | 0.07 | 1.5 | 0.3 |
| Properties of cured film | | | | | | | | |
| Tensile modulus (GPa) | 2.1 | 2.4 | 1.5 | 1.9 | 3.1 | 1.8 | 1.5 | 2.0 |
| Tensile elongation (%) | 8.3 | 6.9 | 9.2 | 8.5 | 3.9 | 8.5 | 9.5 | 8.2 |
| Glass transition temperature (°C.) | 156 | 162 | 150 | 155 | 155 | 159 | 132 | 158 |
| Development quality | | | | | | | | |
| Resolution, L/S (μm) | 20 | 20 | 20 | 20 | 20 | 20 | 30 | 20 |
| Resolution, via (μm) | 30 | 30 | 35 | 30 | 30 | 30 | 40 | 35 |

What is claimed is:

1. An insulating resin composition which comprises a crosslinked elastic polymer in a photo-polymerizable or thermally polymerizable resin composition at the rate of 3–10 parts by weight of said crosslinked elastic polymer per 100 parts by weight of a resin component (excluding said crosslinked elastic polymer and including monomers), said crosslinked elastic polymer (1) having carboxyl groups, (2) having an average primary particle diameter of 100 nm or less, and (3) being dispersed with an average secondary particle diameter in the range of 0.5–2 μm.

2. A laminate of an insulating resin layer and a separable support wherein said insulating resin layer is made up of the insulating resin composition described in claim 1.

3. A laminate as described in claim 2 wherein said insulating resin layer is developable by an aqueous alkaline solution.

4. An insulating resin obtained by polymerizing or curing the insulating resin composition described in claim 1.

5. An insulating resin composition which comprises a crosslinked elastic polymer in a photo-polymerizable or thermally polymerizable resin composition at the rate of 3–10 parts by weight of said crosslinked elastic polymer per 100 parts by weight of a resin component (excluding said crosslinked elastic polymer and including monomers), said crosslinked elastic polymer (1) having carboxyl groups, and (2) being dispersed with an average secondary particle diameter in the range of 0.5–2 μm, wherein said resin component comprises as main ingredients (A) a carboxyl-containing copolymer resulting from the reaction of a diol with a polycarboxylic acid and showing a weight average molecular weight of 3,000–40,000 and an acid value of 50–200 mgKOH/g, (B) an unsaturated compound containing one or more thermally polymerizable ethylenic unsaturated linkages in the molecule, (C) epoxy resin and (D) a photopolymerization initiator at the rate of 100 parts by weight of the sum of components (A) and (B), 10–30 parts by weight of component (C) and 0.1–15 parts by weight of component (D).

6. A laminate of an insulating resin layer and a separable support wherein said insulating resin layer is made up of the insulating resin composition described in claim 5.

7. A laminate as described in claim 6 wherein said insulating resin layer is developable by an aqueous alkaline solution.

8. An insulating resin obtained by polymerizing or curing the insulating resin composition described in claim 5.

9. An insulating resin composition as described in claim 5 wherein the average primary particle diameter of the crosslinked elastic polymer is 100 nm or less.

* * * * *